(12) United States Patent
Kim et al.

(10) Patent No.: US 7,858,412 B2
(45) Date of Patent: Dec. 28, 2010

(54) THIN-FILM TRANSISTOR SUBSTRATE AND METHOD OF FABRICATING THE SAME

(75) Inventors: Joo-Han Kim, Yongin-si (KR); Ki-Hun Jeong, Cheonan-si (KR); Seung-Hwan Shim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/498,534

(22) Filed: Jul. 7, 2009

(65) Prior Publication Data

US 2010/0001275 A1    Jan. 7, 2010

(30) Foreign Application Priority Data

Jul. 7, 2008    (KR) ...................... 10-2008-0065495

(51) Int. Cl.
*H01L 21/3213*    (2006.01)
*H01L 21/336*    (2006.01)

(52) U.S. Cl. .......................... 438/30; 438/670; 438/951; 257/E21.414; 257/E21.025

(58) Field of Classification Search .................. 438/30, 438/670, 951, FOR. 200, FOR. 455; 257/E21.414, 257/E21.025
See application file for complete search history.

(56) References Cited

U.S. PATENT DOCUMENTS

| 6,933,989 | B2 * | 8/2005 | Oke et al. ...................... 349/43 |
| 7,130,003 | B2 * | 10/2006 | Park et al. ...................... 349/54 |
| 7,435,629 | B2 * | 10/2008 | Youn .......................... 438/149 |
| 7,728,331 | B2 * | 6/2010 | Kim et al. ...................... 257/59 |
| 2009/0047749 | A1 * | 2/2009 | Lin et al. ....................... 438/29 |
| 2009/0290083 | A1 * | 11/2009 | Lim et al. ...................... 349/46 |
| 2010/0001275 | A1 * | 1/2010 | Kim et al. ...................... 257/57 |
| 2010/0197058 | A1 * | 8/2010 | Kim et al. ...................... 438/34 |

* cited by examiner

*Primary Examiner*—George Fourson
(74) *Attorney, Agent, or Firm*—Cantor Colburn LLP

(57) ABSTRACT

A thin-film transistor ("TFT") substrate and a method of fabricating the same include: an insulating substrate; gate wiring which is disposed on the insulating substrate and includes a gate line and a gate electrode; a semiconductor pattern which is disposed on the gate electrode; data wiring which is disposed on the semiconductor pattern and includes a data line, a source electrode, and a drain electrode; a passivation layer which includes a first sub-passivation layer and a second sub-passivation layer deposited on the data wiring; and a pixel electrode which is electrically connected to the drain electrode through a contact hole disposed in the passivation layer, wherein the second sub-passivation layer has a lower density than the first sub-passivation layer.

13 Claims, 9 Drawing Sheets

THIN-FILM TRANSISTOR SUBSTRATE AND METHOD OF FABRICATING THE SAME

This application claims priority to Korean Patent Application No. 10-2008-0065495, filed on Jul. 7, 2008, and all the benefits accruing therefrom under 35 U.S.C. §119, the contents of which in its entirety are herein incorporated by reference.

BACKGROUND OF THE INVENTION

1. Field of the Invention

This disclosure relates to a thin-film transistor ("TFT") substrate and a method of fabricating the same.

2. Description of the Related Art

A liquid crystal display ("LCD") includes two substrates, which face each other, and a liquid crystal layer, which is interposed between the two substrates. One of the two substrates is a TFT substrate. The TFT substrate includes a plurality of gate lines, a plurality of data lines, a plurality of TFTs, and a plurality of electrodes. A TFT is disposed as a switching device at each intersection of a gate line and a data line. In addition, pixel electrodes are disposed on each of a plurality of pixels, respectively, and are each electrically connected to a TFT, respectively. The gate lines and the data lines receive a signal from a driving circuit via their respective pads. Each of the TFTs transmits a data signal received through a corresponding data line to a corresponding pixel electrode in response to a scan signal, which is input to a corresponding gate line.

A commercially available method for disposing wiring on a TFT substrate is photolithography, in which a material is disposed and patterned by a mask process. However, photolithography involves a plurality of processes, such as a process of depositing a thin film, coating a photoresist material, mask alignment, exposure, developing, etching, and stripping. Thus, the processing time and the cost of products manufactured with available photolithographic processes are increased.

To reduce the cost of available photolithographic processes, a 4-mask process has been introduced. The 4-mask process omits one process from a commercially available 5-mask process in which photolithography is performed using five masks to form a TFT substrate. Since the 4-mask process involves fewer processes than the 5-mask process, manufacturing costs can be reduced. However, since the 4-mask process is still complicated to perform, there is a limit to cost reduction in available 4-mask processes. In this regard, it would be desirable to provide a method for fabricating a TFT substrate more simply in order to further reduce manufacturing time and cost.

BRIEF SUMMARY OF THE INVENTION

Aspects, features, and advantages of the disclosed embodiments provide a thin-film transistor ("TFT") substrate which can be fabricated at reduced costs and has reduced defects.

Aspects, advantages, and features of the disclosed embodiments also provide a method of fabricating the above TFT substrate.

However, aspects, features, and advantages of the disclosed embodiments are not restricted to those set forth herein. The above and other aspects of the invention will become more apparent to one of ordinary skill in the art to which the invention pertains by reference to the detailed description given below.

The above described and other drawbacks are alleviated by a TFT substrate including: an insulating substrate; gate wiring which is disposed on the insulating substrate and includes a gate line and a gate electrode; a semiconductor pattern which is disposed on the gate electrode; data wiring which is disposed on the semiconductor pattern and includes a data line, a source electrode and a drain electrode; a passivation layer which includes a first sub-passivation layer and a second sub-passivation layer disposed on the data wiring; and a pixel electrode which is electrically connected to the drain electrode through a contact hole which is disposed in the passivation layer, wherein the second sub-passivation layer has a lower density than the first sub-passivation layer.

The first sub-passivation layer and the second sub-passivation layer may include silicon nitride (SiNx), silicon oxide (SiOx), or the like.

The first sub-passivation layer may include SiNx, SiOx, or the like, and the second sub-passivation layer may include amorphous silicon.

A gate insulating film and the first sub-passivation layer may be interposed between the pixel electrode and the insulating substrate.

The gate insulating film, the first sub-passivation layer and the second sub-passivation layer may be interposed between the pixel electrode and the insulating substrate.

The passivation layer may further include a third sub-passivation layer, which is disposed on the second sub-passivation layer.

The third sub-passivation layer may have a higher density than the second sub-passivation layer.

The first sub-passivation layer, the second sub-passivation layer, and the third sub-passivation layer may include SiNx, SiOx, or the like.

The first sub-passivation layer and the third sub-passivation layer may include SiNx, SiOx, or the like, and the second sub-passivation layer may include amorphous silicon.

The substrate may further include a storage electrode, which is disposed on the insulating substrate and on the same layer as the gate wiring.

The storage electrode may be wider than the data line.

Also disclosed is a method of fabricating a TFT substrate. The method includes: disposing gate wiring, which includes a gate line and a gate electrode, on an insulating substrate; disposing a semiconductor pattern and data wiring, which comprises a data line, a source electrode and a drain electrode, on the gate electrode; disposing a passivation layer on the data wiring; disposing a photosensitive film pattern on the passivation layer; etching the passivation layer, which is exposed by the photosensitive film pattern to form a resultant structure; disposing a conductive layer on substantially an entire surface of the resultant structure; heating the photosensitive film pattern at a temperature sufficient to reflow the photosensitive film pattern; and removing the photosensitive film pattern and the conductive layer disposed on the photosensitive film pattern to form a pixel electrode in a pixel region, wherein the photosensitive film pattern includes a first region which covers the source electrode and the drain electrode, and a second region which covers the pixel region and has a thickness which is less than a thickness of the first region.

Cracks may be disposing in the conductive layer disposed on the photosensitive film pattern during the heating of the photosensitive film pattern. The photosensitive film pattern may be heated to a temperature of equal to or greater than about 60° C.

The disposing of the passivation layer may include disposing a first sub-passivation layer and a second sub-passivation layer, which has a lower density than the first sub-passivation layer on the data wiring.

The first sub-passivation layer and the second sub-passivation layer may include an identical material, and the second sub-passivation layer may be disposed at a rate which is greater than a rate at which the first sub-passivation layer is disposed.

The method may further include removing the second region by etching an entire surface of the photosensitive film pattern after the etching of the passivation layer.

The method may further include removing the second sub-passivation layer under the second region after the removing of the second region.

The disposing of the passivation layer may further include disposing a third sub-passivation layer, which has a density which is greater than a density of the second sub-passivation layer, on the second sub-passivation layer.

The second sub-passivation layer and the third sub-passivation layer may be made of an identical material, and the second sub-passivation layer may be disposed at a rate which is greater than a rate at which the third sub-passivation layer is disposed.

BRIEF DESCRIPTION OF THE DRAWINGS

The above and other aspects, advantages, and features of the invention will become more apparent by describing in further detail exemplary embodiments thereof with reference to the attached drawings, in which.

DETAILED DESCRIPTION OF THE INVENTION

Aspects, advantages, and features of the invention and methods of accomplishing the same may be understood more readily by reference to the following detailed description of exemplary embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims. In the drawings, sizes and relative sizes of the layers and regions are exaggerated for clarity.

It will be understood that when an element or layer is referred to as being "on" another element or layer, the element or layer can be directly on another element or layer or intervening elements or layers can be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", or the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Like reference numerals refer to like elements throughout the specification.

The terms "the", "a" and "an" do not denote a limitation of quantity, but rather denote the presence of at least one of the referenced item.

Embodiments described herein will be described referring to plan views and/or cross-sectional views by way of idealized schematic views of exemplary embodiments. Accordingly, the exemplary views may be modified depending on manufacturing technologies and/or tolerances. Therefore, the embodiments are not limited to those shown in the views, but include modifications, such as configurations formed on the basis of manufacturing processes. Therefore, regions exemplified in the figures have schematic properties, and shapes of regions shown in the figures exemplify specific shapes of regions of elements, and are not intended to limit any aspect of the disclosed embodiment.

Hereinafter, exemplary embodiments will be described in detail with reference to the attached drawings.

A liquid crystal display ("LCD") includes a thin-film transistor ("TFT") substrate, an upper substrate, and a liquid crystal layer interposed between the TFT substrate and the upper substrate. The TFT substrate includes a plurality of TFTs, a TFT disposed as a switching device at each intersection of a gate line and a data line. In addition, the upper substrate faces the TFT substrate and includes a plurality of common electrodes.

Figure 1:
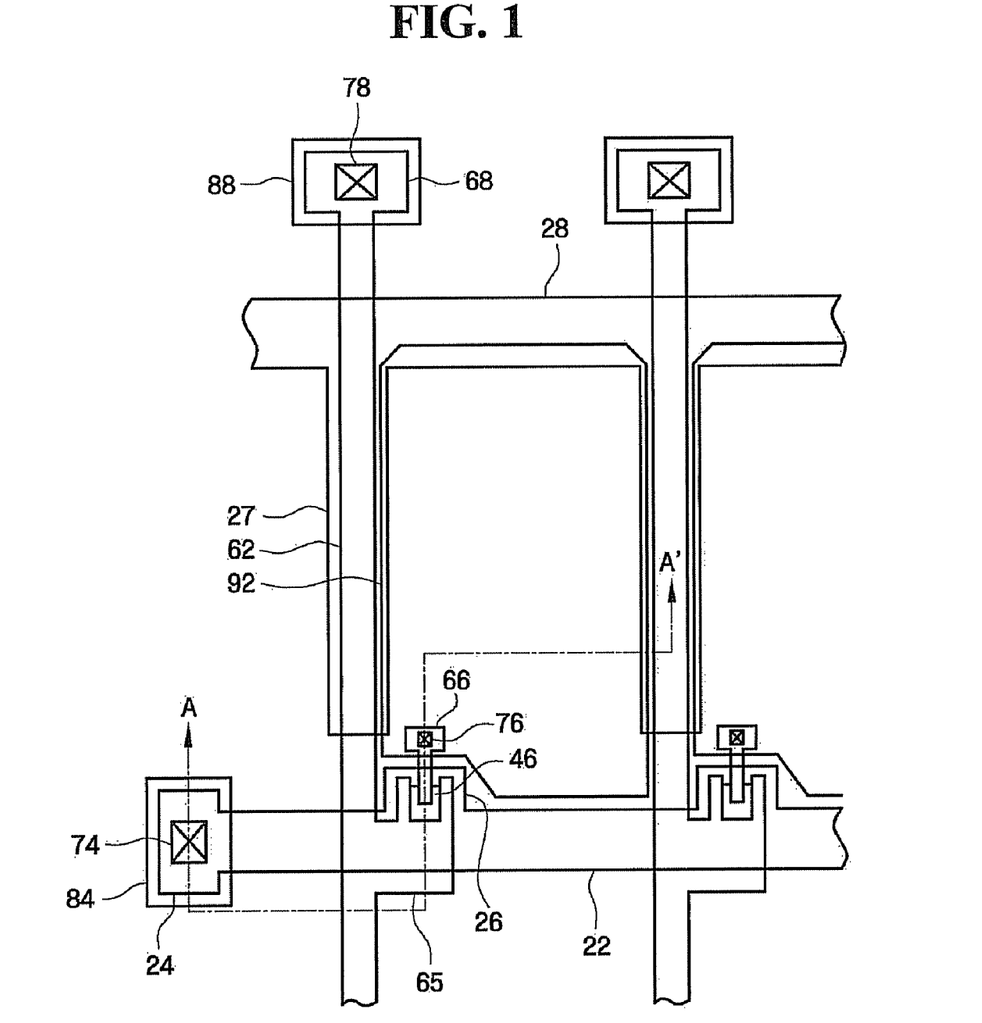
FIG. 1 is a plan view showing an exemplary embodiment of a thin-film transistor ("TFT") substrate.
Figure 2:
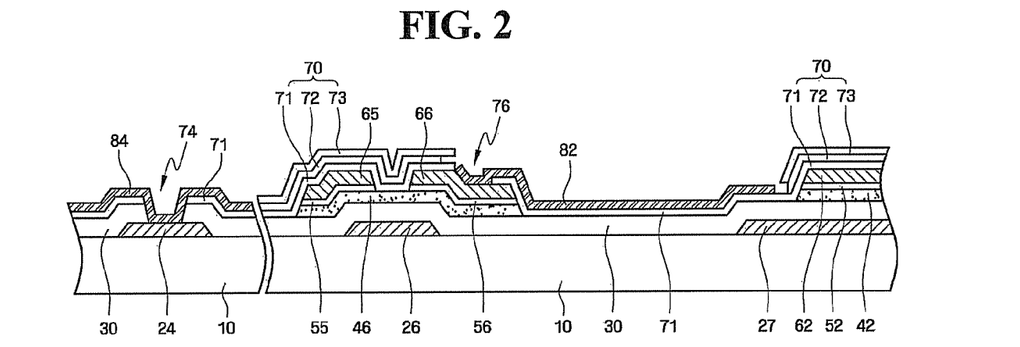
FIG. 2 is a cross-sectional view showing an exemplary embodiment of the TFT substrate of FIG. 1, taken along line A-A' of FIG. 1.

A TFT substrate according to an exemplary embodiment will now be described in detail with reference to FIGS. 1 and 2. FIG. 1 is a plan view showing an exemplary embodiment of a TFT substrate. FIG. 2 is a cross-sectional view showing an exemplary embodiment of the TFT substrate shown in FIG. 1 taken along line A-A' of FIG. 1.

Referring to FIGS. 1 and 2, the TFT substrate includes gate wiring, storage wiring, a gate insulating film 30, a first semiconductor pattern 46, a first ohmic contact pattern 55, a second ohmic contact pattern 56, data wiring, a passivation layer 70, and a pixel electrode 82, which are disposed on an insulating substrate 10. The insulating substrate 10 may comprise a transparent and heat-resistant material, such as a transparent glass, plastic, or the like, or a combination comprising at least one of the foregoing transparent and heat-resistant materials.

The gate wiring is disposed in a first direction, for example, a horizontal direction, on the insulating substrate 10. The gate wiring includes a gate line 22, which delivers a gate signal, and a gate electrode 26, which protrudes from the gate line 22.

In addition, the gate wiring includes a gate line end 24, which is disposed at an end of the gate line 22. The gate line end 24 receives a gate signal from another layer or an external source and delivers the received gate signal to the gate line 22. The gate electrode 26, a source electrode 65, and a drain electrode 66, which are described further below, form three terminals of a TFT.

On the insulating substrate 10, the storage wiring is disposed in a direction parallel to the gate wiring. That is, the storage wiring includes a storage line 28, which extends in the first direction, for example a horizontal direction, and a storage electrode 27, which branches off from the storage line 28 and extends in a second direction, for example a vertical direction, under a data line 62. The storage electrode 27 may have a width, which is greater than a width of the data line 62, to prevent light from leaking around the data line 62. That is, the storage electrode 27 may function as a light-shielding film. A selected voltage, for example, a common voltage (Vcom), is applied to the storage wiring. The storage electrode 27 overlaps the pixel electrode 82, and the gate insulating film 30 is interposed between the storage electrode 27 and the pixel electrode 82 as a dielectric layer, thereby forming a storage capacitor.

Each of the gate wiring and the storage wiring may comprise an aluminum (Al)-based metal, such as Al, an Al alloy, AlNd, AlCu, or the like; a silver (Ag)-based metal, such as Ag, a Ag alloy, or the like; a copper (Cu)-based metal such as Cu, a Cu alloy, or the like; a molybdenum (Mo)-based metal such as Mo, a Mo alloy, Mo, MoN, MoNb, or the like; chrome (Cr), titanium (Ti), tantalum (Ta), or the like, or a combination comprising at least one of the foregoing metals. In an embodiment, each of the gate wiring or the storage wiring comprises Al, AlNd, AlCu, Ag, Cu, Mo, MoN, MoNb, Cr, Ti, Ta, or the like, or a combination comprising at least one of the foregoing metals.

In addition, each of the gate wiring and the storage wiring may comprise a multi-layer structure which includes two conductive layers (not shown), each having different physical characteristics. In an embodiment, one of the two conductive layers may comprise an electrically conductive metal, such as an Al-based metal, a Ag-based metal, or a Cu-based metal, or the like, or a combination comprising at least one of the foregoing electrically conductive metals, in order to reduce a signal delay or a voltage drop in at least one of the gate wiring and the storage wiring. The other conductive layer may comprise a different material, such as a material having superior contact characteristics with indium tin oxide ("ITO"), indium zinc oxide ("IZO"), or the like, or a combination comprising at least one of the foregoing transparent materials, or a material such as a Mo-based metal, Cr, Ti, Ta, or the like, or a combination comprising at least one of the foregoing metals. An exemplary multi-layer structure may include a combination comprising a Cr lower layer and an Al upper layer, or a combination comprising an Al lower layer and a Mo upper layer. However, the disclosed embodiments are not limited thereto. Each of the gate wiring and the storage wiring may comprise various metals and conductors.

The gate insulating film 30 is disposed on the gate wiring, the storage wiring, and the insulating substrate 10, which has portions on which neither the gate wiring nor the storage wiring are disposed. The gate insulating film 30 may comprise an inorganic insulating material, such as silicon nitride (SiNx), silicon oxide (SiOx), or the like, or a combination comprising at least one of the foregoing inorganic insulating materials, or may comprise an organic insulating material, such as benzocyclobutene ("BCB"), an acrylic material, a polyimide, or the like, or a combination comprising at least one of the foregoing organic insulating materials. The gate insulating film 30 is disposed on, and in an embodiment can substantially completely cover, the gate wiring and the storage wiring. In particular, the gate insulating film 30 is disposed on substantially an entire surface of the insulating substrate 10, including a pixel region in which the pixel electrode 82 is disposed. The pixel region may be understood to be a region, which is defined by the gate wiring and the data wiring, and through which light emitted from a backlight assembly (not shown) of an LCD passes.

The first semiconductor pattern 46, which comprises hydrogenated amorphous silicon, polycrystalline silicon, a conductive organic material, or the like, or a combination comprising at least one of the foregoing materials, is disposed on a portion of the gate insulating film 30.

The first semiconductor pattern 46 may have various shapes. For example, the first semiconductor pattern 46 may have an island-like shape, a linear shape, or the like. When the first semiconductor pattern 46 has a linear shape, as in the embodiment shown in FIG. 1, it may be disposed under the data line 62 and may extend onto the gate electrode 26. The first semiconductor pattern 46 may substantially or completely overlap the data wiring. In addition, the first semiconductor pattern 46 may overlap the gate electrode 26 to form a channel portion between the source electrode 65 and the drain electrode 66. The shape of the first semiconductor pattern 46 is not limited to the linear shape. When the first semiconductor pattern 46 has an island-like shape, it may partially overlap at least one of the source electrode 65 and the drain electrode 66 above the gate electrode 26.

The first and the second ohmic contact patterns 55 and 56 are disposed on the first semiconductor pattern 46. The first and the second ohmic contact patterns 55 and 56 comprise a silicide, n+ hydrogenated amorphous silicon which is doped with n-type impurities in high concentration, a material doped with p-type impurities, such as ITO, or the like, or a combination comprising at least one of the foregoing materials. The first and the second ohmic contact patterns 55 and 56 are disposed in pairs on the first semiconductor pattern 46 to provide a resultant structure. The first and the second ohmic contact patterns 55 and 56 improve a contact characteristic between the source electrode 65 and the first semiconductor pattern 46, and between the drain electrode 66 and the first semiconductor pattern 46. In an embodiment, the first and the second ohmic contact patterns 55 and 56 may be omitted. For example the first and the second ohmic contact patterns 55 and 56 may be omitted when the contact resistance between the source electrode 65 and the first semiconductor pattern 46 are less than a selected contact resistance, or when a contact resistance between the drain electrode 66 and the first semiconductor pattern 46 are less than a selected contact resistance.

On the resultant structure, which includes the first and the second ohmic contact patterns 55 and 56, the data wiring is disposed. The data wiring includes the data line 62, the source electrode 65, the drain electrode 66, and a data line end 68.

The data line 62 extends in the second direction, for example, the vertical direction. In addition, the data line 62 is insulated from the gate line 22 and crosses the gate line 22.

The source electrode 65 protrudes from the data line 62 in the form of a branch and extends onto the first semiconductor pattern 46. The data line end 68 is disposed at an end of the data line 62. The data line end 68 receives a data signal from another layer, or an external source, and delivers the received data signal to the data line 62. The source electrode 65 at least partially overlaps the first semiconductor pattern 46. The drain electrode 66 is separated from the source electrode 65, is disposed above the first semiconductor pattern 46, and faces the source electrode 65 with respect to the gate electrode 26. The gap between the source electrode 65 and the drain electrode 66 exposes the first semiconductor pattern 46.

A TFT is a three-terminal device comprising the gate electrode 26, the source electrode 65, and the drain electrode 66. In addition, the TFT is a switching device, which controls the flow of electric current between the source electrode 65 and the drain electrode 66 when a voltage is applied to the gate electrode 26.

The drain electrode 66 includes a bar-shaped pattern, which is disposed above the first semiconductor pattern 46, and a drain electrode extension portion, which extends from the bar-shaped pattern, has an area, and overlaps a contact hole 76.

The data wiring may include a single layer or multiple layers. The data wiring can comprise Al, an Al alloy such as AlNd, AlCu, or the like; Cr, a Cr alloy, or the like; Mo, a Mo alloy such as Mo, MoN, MoNb, or the like; Ta, a Ta alloy, or the like; Ti, a Ti alloy, or the like; or a combination comprising at least one of the foregoing metals. In an embodiment, the data wiring can comprise Al, AlNd, AlCu, Cr, Mo, MoN, MoNb, Ta, Ti, or the like, or a combination comprising at least one of the foregoing metals. In another embodiment, the data wiring may comprise a refractory metal such as Cr, a Mo-based metal, Ta, Ti, or the like, or a combination comprising at least one of the foregoing refractory metals. In addition, the data wiring may comprise a multi-layer structure comprising a lower layer (not shown), which comprises a refractory metal, and an upper layer (not shown), which comprises an electrically conductive material and is disposed on the lower layer. The multi-layer structure may be a double-layer structure, comprising a combination of a Cr lower layer and an Al upper layer, or a combination of an Al lower layer and a Mo upper layer. However, the disclosed embodiment is not limited thereto. The multi-layer structure may comprise a triple-layer structure comprising an Al layer interposed between Mo layers.

The passivation layer 70 is disposed on the data wiring (i.e., the data line 62, the source electrode 65, and the drain electrodes 66, and the data line end 68) and an exposed portion of the gate insulating film 30. The passivation layer 70 can comprise a triple-layer structure comprising a first sub-passivation layer 71, a second sub-passivation layer 72, and a third sub-passivation layer 73, which are sequentially stacked. The second sub-passivation layer 72 may comprise a material having a density that is less than a density of the material of the first sub-passivation layer 71. In addition, the second sub-passivation layer 72 may comprise a material having a density that is less than a density of the material of the third sub-passivation layer 73. When the density of the second sub-passivation layer 71 is less than a density of the first sub-passivation layer 71, the second sub-passivation layer 71 may be over-etched in the etching process of the passivation layer 70. Thus, it has been observed that the pixel electrode 82 can be disposed more easily. The etching process of the passivation layer 70 is described in further detail below.

When the first through the third sub-passivation layers 71 through 73 comprise an identical material, the deposition rate of each of the first through the third sub-passivation layers 71 through 73 may be selected to control the density thereof. Specifically, it can be desirable to dispose the second sub-passivation layer 72 at a rate, which is greater than a rate at which the first sub-passivation layer 71 is deposited, or at a rate at which the third sub-passivation layer 73 is disposed. The first through the third sub-passivation layers 71 through 73 may all comprise SiNx, SiOx, or the like, or a combination comprising at least one of the foregoing materials.

The first and the third sub-passivation layers 71 and 73 may comprise a first material which is different from a second material, where the second sub-passivation layer 72 can comprise the second material, so that the second sub-passivation layer 72 can have a density that is less than a density of at least one of the first and the third sub-passivation layers 71 and 73. In an embodiment, the first material may comprise SiNx, SiOx, or the like, or a combination comprising at least one of the foregoing materials, and the second material may comprise an amorphous silicon material, such as amorphous silicon oxycarbide (a-Si:C:O), amorphous silicon oxyfluoride, (a-Si:O:F), or the like, or a combination comprising at least one of the foregoing amorphous silicon materials. The first and the third sub-passivation layers 71 and 73 may comprise different materials. That is, the first and the third sub-passivation layers 71 and 73 may comprise any compatible materials so long as they have a density, which is greater than a density of the second sub-passivation layer 72.

All of the first through the third sub-passivation layers 71 through 73 remain on the TFT. However, under the portion of the pixel electrode 82 that corresponds to the pixel region, only the first sub-passivation layer 71 remains while the second and the third sub-passivation layers 72 and 73 are removed. In addition, only the first sub-passivation layer 71 remains in a region which is adjacent to the gate line end 24.

Contact holes 76 and 78, which expose the drain electrode 66 and the data line end 68, respectively, are formed in the passivation layer 70. In addition, a contact hole 74 is disposed in the passivation layer 70 and the gate insulating film 30 to expose the gate line end 24.

The pixel electrode 82 is disposed on the first sub-passivation layer 71 within the pixel region and is connected to the drain electrode 66 by the contact hole 76. A gate pad 84 is disposed on the first sub-passivation layer 71, which is adjacent to the gate line end 24. In addition, a data pad 88 is disposed on the passivation layer 70, which is adjacent to the data line end 68. The gate pad 84 and the data pad 88 respectively connect the gate line end 24 and the data line end 68 to an external device. Each of the pixel electrode 82, the gate pad 84, and the data pad 88 may comprise a transparent conductor, such as ITO, IZO, or the like, or a reflective conductor such as Al, or the like, or a combination comprising at least one of the foregoing materials.

In the TFT substrate described above, the first sub-passivation layer 71 as well as the gate insulating film 30 remain in the pixel region. Accordingly, a height difference between a top surface of the passivation layer 70 on the TFT and the passivation layer 70 in the pixel region is substantially reduced. Consequently, rubbing defects can be prevented from occurring around a region where the height difference occurs when an alignment layer (not shown), which can be disposed on the pixel electrode 82, is rubbed. In addition, when ball spacers are interposed between the TFT substrate and the upper substrate in order to maintain a gap (hereinafter, referred to as a "cell gap") between them, the reduced height difference can substantially reduce a non-uniformity of the cell gap due to a difference between a height of a top surface of a spacer disposed on an upper portion of the TFT substrate and a height of a top surface of a spacer disposed on a lower portion of the TFT substrate.

Figure 3:
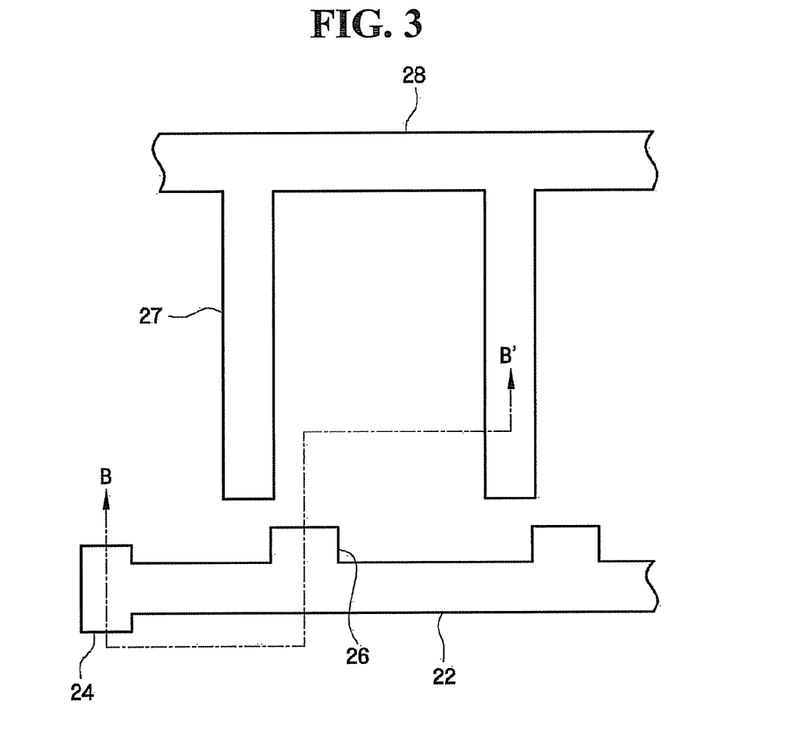
FIG. 3 is a plan view showing an exemplary embodiment of a TFT substrate in a method of fabricating a TFT substrate.
Figure 4:
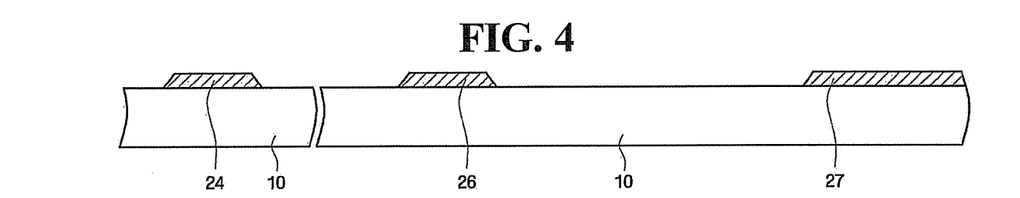
FIG. 4 is a cross-section view showing an exemplary embodiment of the TFT substrate of FIG. 3, taken along line B-B' of FIG. 3.
Figure 5:
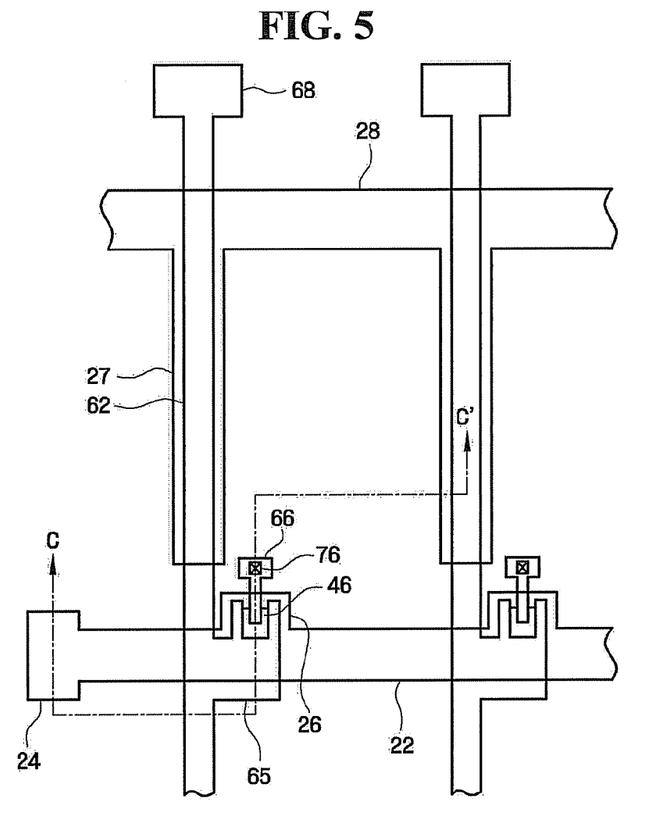
FIG. 5 is a plan view showing an exemplary embodiment of a TFT substrate in a method of fabricating the TFT substrate.

Hereinafter, a method of fabricating a TFT substrate according to an exemplary embodiment will be described in detail with reference to FIGS. 3 through 16. FIGS. 3, 5 and 10 are plan views showing an exemplary embodiment of a TFT substrate in a method of fabricating a TFT substrate. FIGS. 4, 6 through 9, and 11 through 16 are cross-sectional views showing an exemplary embodiment of a TFT substrate in the method of fabricating a TFT substrate. Specifically, FIG. 4 is a cross-sectional view of a TFT substrate taken along line B-B' of FIG. 3. FIGS. 6 through 9 are cross-sectional views of the TFT substrate taken along line C-C' of FIG. 5. FIGS. 11 through 16 are cross-sectional views of the TFT substrate taken along line D-D' of FIG. 10.

Referring to FIGS. 3 and 4, gate wiring, which includes a gate electrode 26, and storage wiring are disposed on an insulating substrate 10. Specifically, a gate conductive layer is disposed on the insulating substrate 10 by, for example, sputtering, or the like. Then, a photolithography process is performed on the gate conductive layer to form a gate line 22, the gate electrode 26, a gate line end 24, a storage line 28, and a storage electrode 27.

Figure 6:
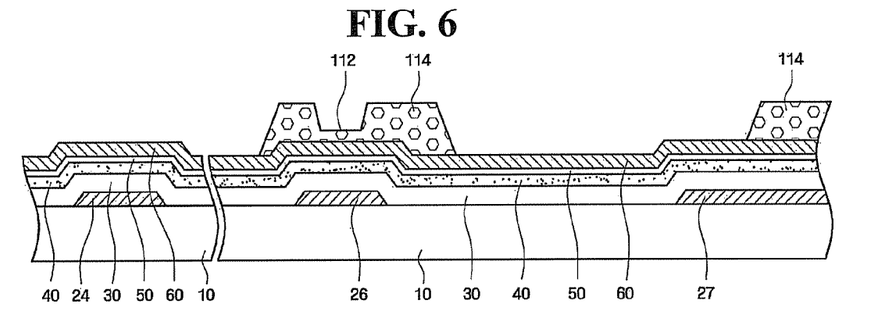
FIGS. 6 through 9 are cross-sectional views showing an exemplary embodiment of the TFT substrate of FIG. 5, taken along line C-C' of FIG. 5.

Referring to FIGS. 5 and 6, a gate insulating film 30, a semiconductor layer 40, and an ohmic contact layer 50 are disposed on a resultant structure, which is shown in FIGS. 3 and 4. The gate insulating film 30, the semiconductor layer 40, and the ohmic contact layer 50 may be disposed by, for example, chemical vapor deposition ("CVD"), or the like.

Figure 7:
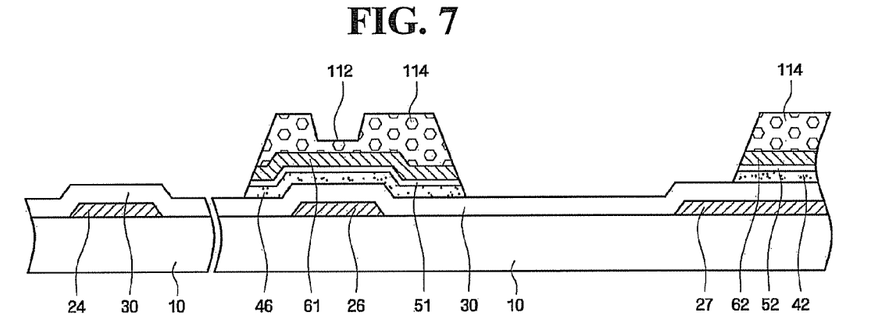

Next, a data conductive layer 60 is disposed on the ohmic contact layer 50 by, for example, sputtering, or the like, and a photosensitive film is disposed on the data conductive layer 60. Then, the photosensitive film is patterned to form a photosensitive film pattern. The photosensitive film pattern is divided into two regions, each having a different thickness. Specifically, a first region 114 is disposed on a data line 62 (as is shown in FIG. 7) and above the gate electrode 26, and a second region 112, which is has a thickness which is less than a thickness of the first region 114, is disposed in a region where a channel portion is to be disposed above the gate electrode 26. The photosensitive film pattern, having the two regions of different thicknesses, may be disposed using a slit mask or a half-tone mask.

Referring to FIGS. 5 through 7, an exposed portion of the data conductive layer 60 is etched using the photosensitive pattern as an etching mask. The etching process of the data conductive layer 60 may vary according to the type and thickness of the data conductive layer 60. For example, the data conductive layer 60 may be wet-etched. As a result of a wet-etching process, the data line 62 and a data pattern 61 are disposed. In an embodiment, the data pattern 61, which is disposed above the gate electrode 26, remains substantially monolithic without being divided into a source electrode 65 and a drain electrode 66.

Next, an exposed portion of the ohmic contact layer 50 and a portion of the semiconductor layer 40, which is under the exposed portion of the ohmic contact layer 50, are etched using the photosensitive film pattern as an etching mask to dispose a third and a fourth ohmic contact patterns 51 and 52 and a first and a second semiconductor patterns 46 and 42 under the third and the fourth ohmic contact patterns 51 and 52, respectively. Here, the ohmic contact layer 50 and the semiconductor layer 40 may be dry-etched, for example. As a result of the dry-etching process, the gate insulating film 30 is exposed.

In the above processes, the data conductive layer 60, the ohmic contact layer 50, and the semiconductor layer 40 disposed above the gate line end 24 are also removed. Thus, the gate insulating film 30, disposed on the gate line end 24, is also exposed.

Figure 8:
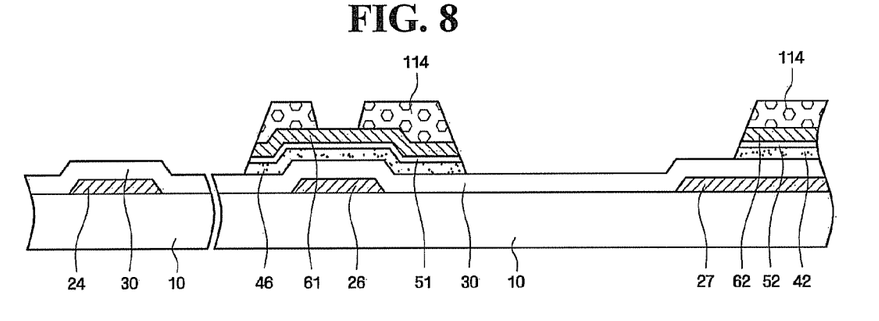

Referring to FIGS. 5 and 8, substantially an entire surface of the photosensitive film pattern is etched. As a result, the second region 112, which has a thickness which is less than a thickness of the first region 114, is removed, thereby exposing the data pattern 61 thereunder. Thus, the thickness of the first region 114 is reduced. This process of etching the entire surface of the photosensitive film pattern may comprise an ashing process that uses, for example, an oxygen plasma, or the like. If the second region 112 is also removed when the ohmic contact layer 50 and the semiconductor layer 50 are etched, the ashing process may be omitted.

Figure 9:
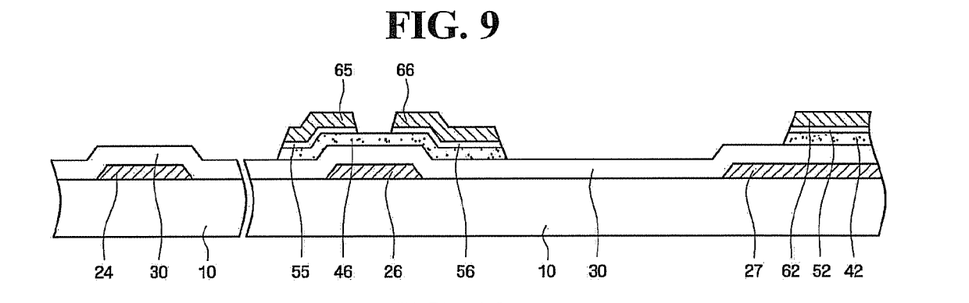
Figure 10:
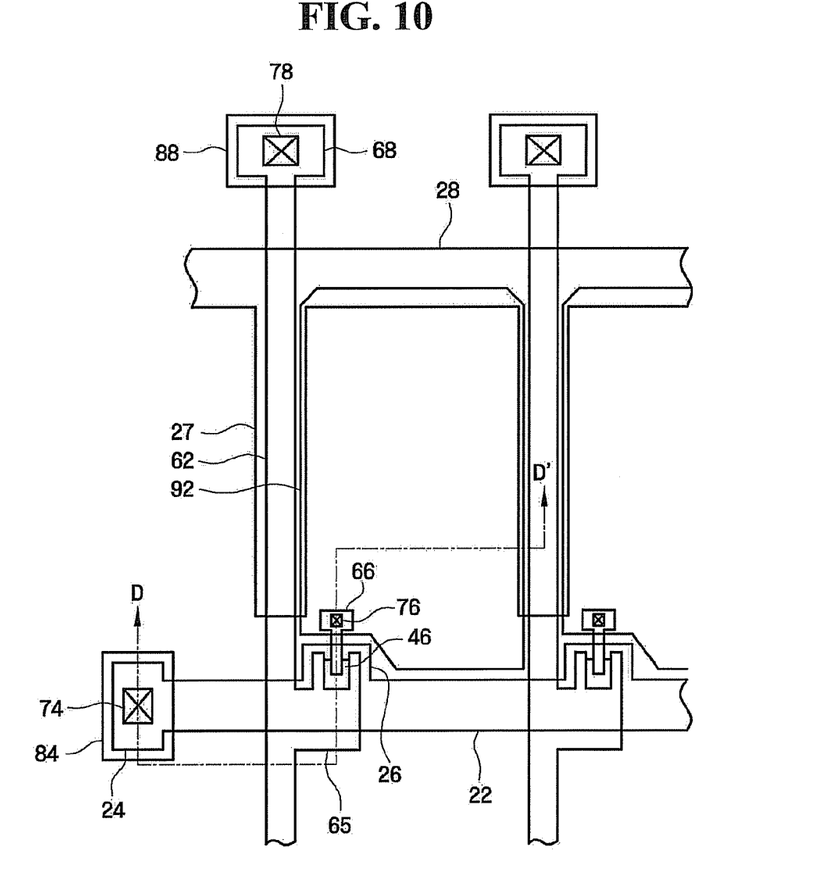
FIG. 10 is a plan view showing an exemplary embodiment of a TFT substrate in a method of fabricating a TFT substrate.

Referring to FIGS. 5 and 9, an exposed portion of the data line 61, and the ohmic contact pattern 51 under the exposed portion of the data line 61, are etched using the first region 114 as an etching mask. As a result, the data pattern 61 is divided into the source electrode 65 and the drain electrode 66, and the ohmic contact pattern 51 is divided into a pair of ohmic contact patterns, specifically the first and the second ohmic contact patterns 55 and 56. Here, the first semiconductor pattern 46, exposed between the first and the second ohmic contact patterns 55 and 56, may be partially etched.

Figure 11:
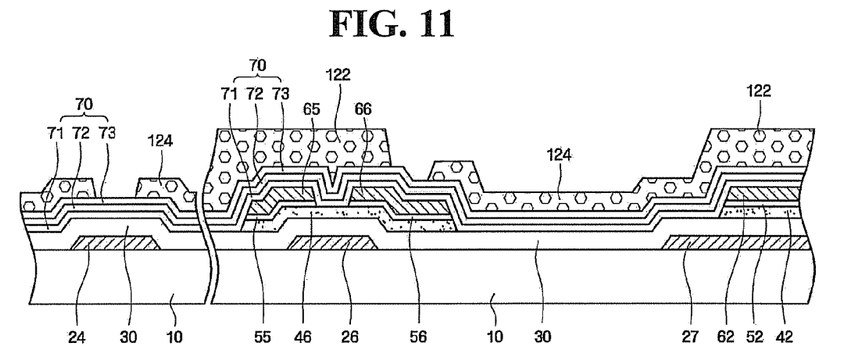
FIGS. 11 through 16 are cross-sectional views showing an exemplary embodiment of the TFT substrate of FIG. 10, taken along line D-D' of FIG. 10.

Referring to FIGS. 10 and 11, a passivation layer 70 is disposed on the resultant structure shown in FIG. 9 by, for example, CVD. Specifically, the first through the third sub-passivation layers 71 through 73 are sequentially disposed to form the passivation layer 70. Thus, the first through the third sub-passivation layers 71 through 73 may be in-situ deposited.

Next, a photosensitive film is disposed on the passivation layer 70 and then patterned to form a photosensitive film pattern. The photosensitive film pattern is divided into two regions having different thicknesses. Specifically, the photosensitive film pattern includes a first region 122 and a second region 124, which has a thickness which is less than a thickness of the first region 122. The first region 122 is disposed on a TFT. In addition, the second region 124 is disposed above a portion of the drain electrode 66, a pixel region, and the gate line end 24. The photosensitive film pattern includes apertures disposed above the gate line end 24, the portion of the drain electrode 66, and a data line end 68. The photosensitive film pattern may be disposed using a slit mask or a half-tone mask.

Figure 12:
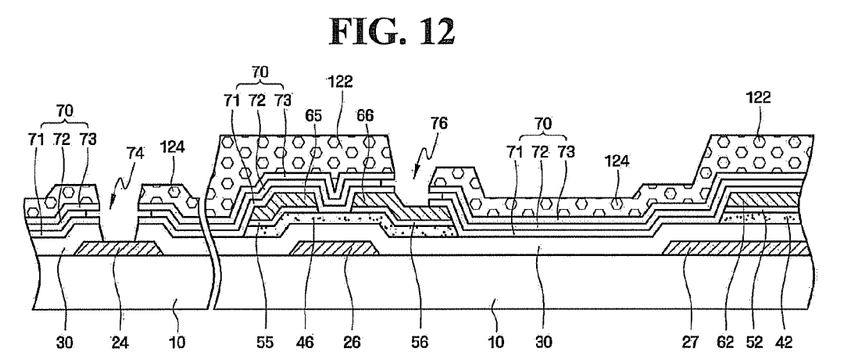

Referring to FIGS. 10 and 12, an exposed portion of the passivation layer 70 and the gate insulating film 30 under the exposed portion of the passivation layer 70 are etched using the photosensitive film pattern as an etching mask. Here, the etching process may comprise a dry-etching process, and an etching gas used in the dry-etching process may comprise $CF_4$, $SF_6$, $CHF_3$, $O_2$, the like, or a combination comprising at least one of the foregoing gases. In addition, a combination of etching gases, or a gas composition ratio in the combination, may be selected to control an etch rate. Since the second sub-passivation layer 72 has a density which is less than a density of the first and the third sub-passivation layers 71 and 73, it may be over-etched, thereby generating an undercut.

Figure 13:
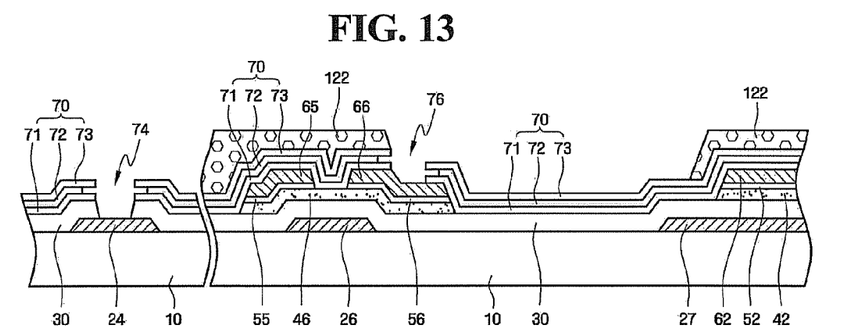

Referring to FIGS. 10 and 13, substantially an entire surface of the photosensitive film pattern is etched. As a result, the second region 124, which has a thickness which is less than a thickness of the first region 122, is removed, thereby exposing the passivation layer 70 in the pixel region and above the gate line end 24. In this case, the thickness of the first region 122 is reduced. This process of etching substantially the entire surface of the photosensitive film pattern may comprise an ashing process that uses, for example, an oxygen plasma, or the like.

Figure 14:
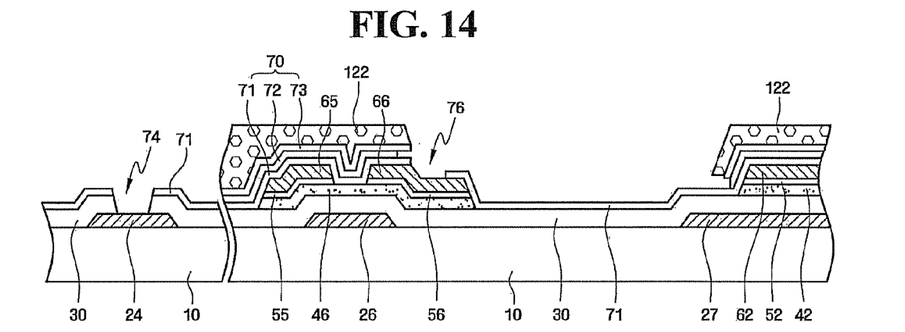

Referring to FIGS. 10 and 14, the third and the second sub-passivation layers 73 and 72 are etched. Here, the etching process may comprise a dry-etching process, and an etching gas used in the dry-etching process may comprise $CF_4$, $SF_6$, $CHF_3$, $O_2$, or the like, or a combination comprising at least one of the foregoing gases. In addition, a combination of etching gases, or a gas composition ratio in the combination, may be selected to control an etch rate. Since the first sub-passivation layer 71 has a higher density than the second sub-passivation layer 72, it may have a higher etch selectivity, even under the same etching conditions.

Figure 15:
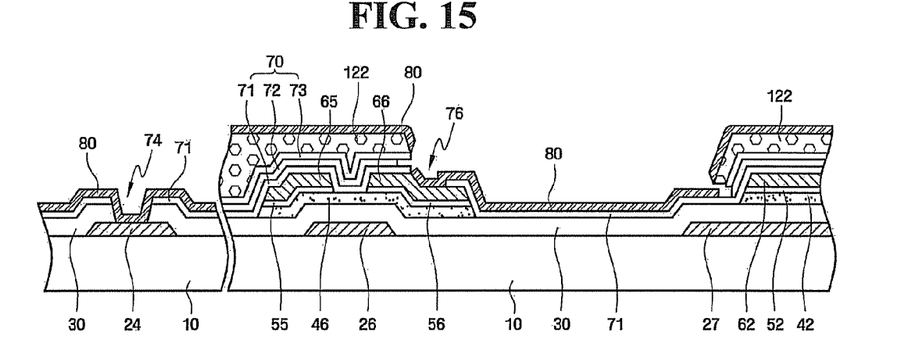

Referring to FIGS. 10 and 15, a conductive layer 80 for forming a pixel electrode is disposed on substantially the entire surface of the resultant structure shown in FIG. 14 by, for example, sputtering, or the like. Here, as the second sub-passivation layer 72 is over-etched, the conductive layer 80 forms a discontinuous region around the second sub-passivation layer 72. Because of the discontinuous region, the conductive layer 80 on the first region 122 can be removed in a subsequent strip-off process.

Figure 16:
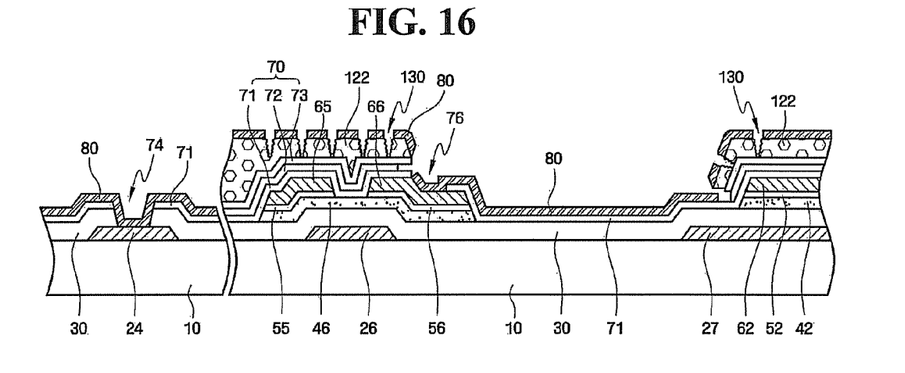

Referring to FIGS. 10 and 16, the resultant structure shown in FIG. 15, which includes the first region 122, is heated at a temperature and for a time sufficient to reflow the first region 122. For example, the resultant structure may be heated to equal to or greater than about 60° C., specifically, equal to or greater than about 100° C. In an embodiment, the resultant structure is heated to a temperature between about 40° C. to about 400° C., specifically about 50° C. to about 300° C. The resultant structure may be heated to a temperature that does not affect other structures. As a result of the heating process, a slit 130 is disposed in the first region 122, which comprises an organic material, and thus has heat-sensitive properties. Accordingly, cracks are disposed in the conductive layer 80, which is in contact with the first region 122.

Next, the first region 122 and the conductive layer 80 disposed on the first region 122 are removed in a strip-off process. Specifically, a stripper, which comprises an amine-based material, a glycol-based material, or the like, or a combination comprising at least one of the foregoing materials, is disposed onto the slits 130. Exemplary methods of disposing the stripper on slits 130 include spraying, dipping, or the like. Then, the stripper dissolves the first region 122 and thus exfoliates the first region 122 from the passivation layer 70 while also removing the conductive layer 80, which is disposed on the first region 122. When the first region 122 is removed in the reflow and strip-off processes described above, the slits 130 are disposed in the first region 122, and thus a contact area between the first region 122 and the stripper is increased. Therefore, there is no need to over-etch the passivation layer 70 in order to increase the contact area between the first region 122 and the stripper. Since the passivation layer 70 is not over-etched, degradation of the quality of the passivation layer 70, or the skew phenomenon, can be substantially reduced, or effectively prevented.

Figure 17:
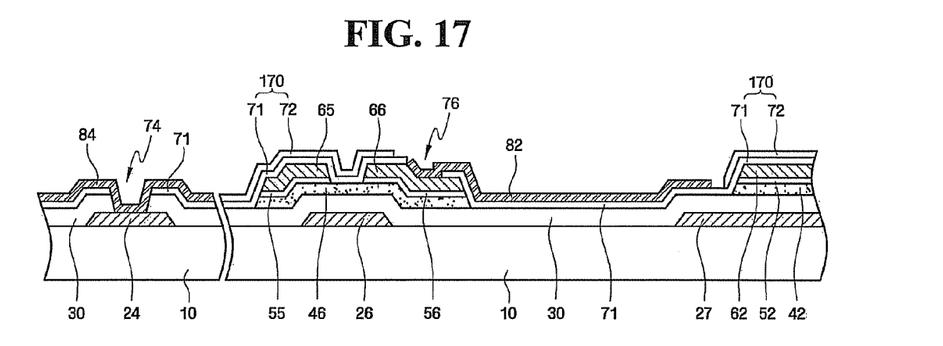
FIG. 17 is a cross-sectional view showing another exemplary embodiment of a TFT substrate.

Referring to FIG. 17, after the first region 122 and the conductive layer 80 disposed on the first region 122 are removed, a pixel electrode 82 is disposed on the first sub-passivation layer 71 in the pixel region.

Hereinafter, a TFT substrate and a method of fabricating the same according to another exemplary embodiment will be described with reference to FIG. 17. FIG. 17 is a cross-sectional view of a TFT substrate according to another exemplary embodiment. For simplicity, a description of elements substantially identical to those of the previous embodiment described above will be omitted, and differences between the present and previous embodiments are described.

Referring to FIG. 17, a passivation layer 170 according to the present embodiment has a double-layer structure comprising a first and a second sub-passivation layers 71 and 72, which are sequentially stacked. The second sub-passivation layer 72 may comprise a material having a density that is less than a density of the first sub-passivation layer 71. When the density of the second sub-passivation layer 72 is less than the density of the first sub-passivation layer 71, the second sub-passivation layer 72 may be over-etched in the etching process of the passivation layer 170, thereby making it easier to dispose a pixel electrode 82.

The TFT substrate according to the present embodiment may be fabricated using the same method described above in the previous embodiment (see FIGS. 3 through 16), except that two layers are disposed to form the passivation layer 170.

Figure 18:
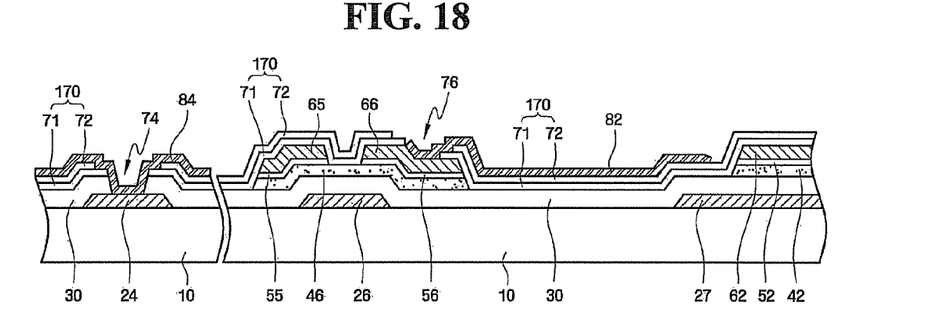
FIG. 18 is a cross-sectional view showing another exemplary embodiment of a TFT substrate.
Figure 19:
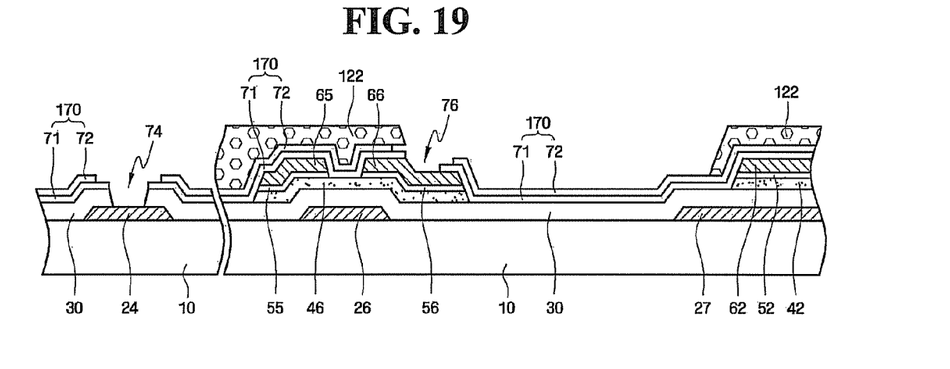
FIGS. 19 through 21 are cross-sectional views showing an exemplary embodiment of a TFT substrate in a method of fabricating the TFT substrate of FIG. 18.
Figure 20:
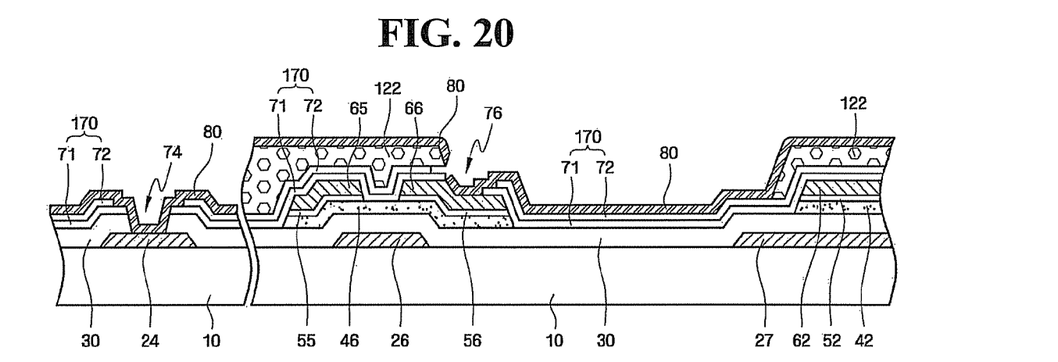
Figure 21:
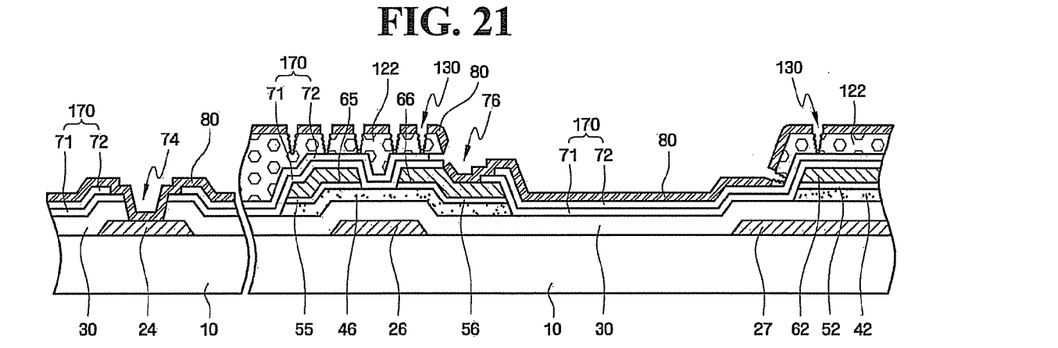

Hereinafter, a TFT substrate and a method of fabricating the same according to another exemplary embodiment will be described with reference to FIGS. 18 through 21. FIG. 18 is a cross-sectional view of a TFT substrate according to another exemplary embodiment. FIGS. 19 through 21 are cross-sectional views showing another exemplary embodiment of a TFT substrate in a method of fabricating the TFT substrate shown in FIG. 18. For simplicity, a description of elements substantially identical to those of the previous embodiments described above will be omitted, and differences between the present and previous embodiments are described.

Referring to FIG. 18, the process of additionally removing a second sub-passivation layer 72 in a pixel region may be omitted. Therefore, a passvation layer 170 maintains a double-layer structure comprising a first sub-passivation layer 71 and a second sub-passivation layer 72 under a pixel electrode 82.

Hereinafter, a method of fabricating a TFT substrate according to another exemplary embodiment will be described in detail with reference to FIGS. 19 through 21.

In the processes described above with reference to FIGS. 3 through 12, a gate electrode 26, the first and the second semiconductor patterns 46 and 42, a source electrode 65, and a drain electrode 66 are disposed on an insulating substrate 10. On the resultant structure, a passivation layer 170, comprising a first sub-passivation layer 71 and a second sub-passivation layer 72, is disposed. Then, an exposed portion of the passivation layer 170 and a gate insulating film 30 under the exposed portion of the passivation layer 170 are etched using a photosensitive film pattern as an etching mask. Here, the etching process may comprise a dry-etching process, and an etching gas used in the dry-etching process may comprise $CF_4$, $SF_6$, $CHF_3$, $O_2$, or the like, or a combination comprising at least one of the foregoing gases. In addition, a combination of etching gases, or a gas composition ratio in the combination, may be selected to control an etch rate. Since the second sub-passivation layer 72 has a density which is less than a density of the first sub-passivation layer 71, it may be over-etched, thereby generating an undercut.

Referring to FIG. 19, a second region 124, which has a thickness that is less than a thickness of a first region 122 of the photosensitive film pattern, is removed to expose a pixel region and the passivation layer 170 disposed on a gate line end 24. Here, the thickness of the first region 122 is reduced. This etch-back process of the photosensitive film pattern may comprise an ashing process that uses, for example, an oxygen plasma, or the like.

Referring to FIG. 20, a conductive layer 80 for forming a pixel electrode is disposed on substantially the entire surface of a resultant structure, which is show in FIG. 19 by, for example, sputtering, or the like. Thus, as the second sub-passivation layer 72 is over-etched, the conductive layer 80 forms a discontinuous region around the second sub-passivation layer 72. Because of to the discontinuous region, the conductive layer 80 on the first region 122 can be removed in a subsequent strip-off process.

Referring to FIG. 21, the resultant structure shown in FIG. 20, which includes the first region 122, is heated at a temperature and for a time sufficient to reflow the first region 122. For example, the resultant structure may be heated to equal to or greater than about 60° C., specifically equal to or greater than about 100° C. In an embodiment, the resultant structure is heated to a temperature between about 40° C. to about 400° C., specifically about 50° C. to about 300° C. As a result of the heating process, a slit 130 is disposed in the first region 122, which comprises an organic material, and thus has heat-sensitive properties. Accordingly, cracks are disposed in the conductive layer 80, which is in contact with the first region 122.

Next, the first region 122 and the conductive layer 80 disposed on the first region 122 are removed in a strip-off process. Specifically, a stripper, which contains an amine-based material, a glycol-based material, or the like, or a combination comprising at least one of the foregoing materials, is disposed onto the slits 130. Exemplary methods of disposing the stripper on the slits 130 include spraying, dipping, or the like. Then, the stripper melts the first region 122 and thus exfoliates the first region 122 from the passivation layer 170, while also removing the conductive layer 80 disposed on the first region 122. When the first region 122 is removed in a reflow and strip-off process, as described above, the slits 130 are disposed in the first region 122, and thus a contact area between the first region 122 and the stripper is increased. Therefore, there is no need to over-etch the passivation layer 70 in order to increase the contact area between the first region 122 and the stripper. Since the passivation layer 70 is not over-etched, degradation of the quality of the passivation layer 70, including the skew phenomenon, can be substantially reduced, or effectively prevented.

Referring to FIG. 18, after the first region 122 and the conductive layer 80 disposed on the first region 122 are removed, a pixel electrode 82 is disposed on the first sub-passivation layer 71 in the pixel region.

In the above described exemplary embodiments, a passivation layer comprises of two or more layers. However, the disclosed embodiments are not limited thereto. That is, when a passivation layer and a conductive layer for forming a pixel electrode disposed on the passivation layer are removed in the reflow and strip-off processes, the same actions and effects that can be obtained when the passivation layer comprises two or more layers can be obtained when the passivation layer comprises a single layer.

While the invention has been particularly shown and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A method of fabricating a TFT substrate, the method comprising:
   disposing gate wiring, which comprises a gate line and a gate electrode on an insulating substrate;
   disposing a semiconductor pattern and data wiring, which comprises a data line, a source electrode, and a drain electrode on the gate electrode;
   disposing a passivation layer on the data wiring;
   disposing a photosensitive film pattern on the passivation layer;
   etching the passivation layer, which is exposed by the photosensitive film pattern, to form a resultant structure;
   disposing a conductive layer on substantially an entire surface of the resultant structure;
   heating the photosensitive film pattern at a temperature sufficient to reflow the photosensitive film pattern; and
   removing the photosensitive film pattern and the conductive layer disposed on the photosensitive film pattern to form a pixel electrode in a pixel region,
   wherein the photosensitive film pattern comprises a first region which covers the source electrode and the drain electrode, and a second region which covers the pixel region and has a thickness which is less than a thickness of the first region.

2. The method of claim 1, wherein cracks are formed in the conductive layer disposed on the photosensitive film pattern during the heating of the photosensitive film pattern.

3. The method of claim 2, wherein the photosensitive film pattern is heated to a temperature of equal to or greater than about 60° C.

4. The method of claim 1, wherein the disposing of the passivation layer comprises disposing a first sub-passivation layer and a second sub-passivation layer, which has a density that is less than a density of the first sub-passivation layer, on the data wiring.

5. The method of claim 4, wherein the first sub-passivation layer and the second sub-passivation layer comprise an identical material, and the second sub-passivation layer is disposed at a rate which is greater than a rate at which the first sub-passivation layer disposed.

6. The method of claim 5, wherein the first sub-passivation layer and the second sub-passivation layer comprise silicon nitride, silicon oxide, or a combination comprising silicon nitride and silicon oxide.

7. The method of claim 4, wherein the first sub-passivation layer comprises silicon nitride, silicon oxide, or a combination comprising silicon nitride and silicon oxide, and the second sub-passivation layer comprises amorphous silicon.

8. The method of claim 4, further comprising removing the second region by etching substantially an entire surface of the photosensitive film pattern after the etching of the passivation layer.

9. The method of claim 8, further comprising removing the second sub-passivation layer under the second region after removing the second region.

10. The method of claim 4, wherein disposing the passivation layer further comprises disposing a third sub-passivation layer, which has a density which is greater than a density of the second sub-passivation layer, on the second sub-passivation layer.

11. The method of claim 10, wherein the second sub-passivation layer and the third sub-passivation layer comprise an identical material, and the second sub-passivation layer is disposed at a rate which is greater than a rate at which the third sub-passivation layer is disposed.

12. The method of claim 11, wherein the first sub-passivation layer, the second sub-passivation layer, and the third sub-passivation layer comprise silicon nitride, silicon oxide, or a combination comprising silicon nitride and silicon oxide.

13. The method of claim 10, wherein the first sub-passivation layer and the third sub-passivation layer comprise silicon nitride, silicon oxide, or a combination comprising silicon nitride and silicon oxide, and the second sub-passivation layer comprises amorphous silicon.

* * * * *